United States Patent [19]

Ishihara et al.

[11] 4,287,297

[45] Sep. 1, 1981

[54] LIQUID COMPOSITION FOR TREATING PHOTOSENSITIVE LAMINATES HAVING ALCOHOL-SOLUBLE POLYAMIDE LAYER

[75] Inventors: Tetsuo Ishihara, Itami; Keizi Kubo, Amagasaki, both of Japan

[73] Assignee: Daicel Chemical Industries Ltd., Osaka, Japan

[21] Appl. No.: 126,600

[22] Filed: Mar. 3, 1980

[30] Foreign Application Priority Data

Mar. 9, 1979 [JP] Japan .................................. 54-27522

[51] Int. Cl.$^3$ .............................................. G03C 5/00
[52] U.S. Cl. ................................ 430/435; 156/659.1; 430/299; 430/323; 430/486
[58] Field of Search ............... 430/299, 323, 435, 436, 430/464, 486, 493, 331; 156/659.1; 252/156, 158

[56] References Cited

U.S. PATENT DOCUMENTS

| | | | |
|---|---|---|---|
| 2,220,252 | 11/1940 | Loeffler | ................................ 430/299 |
| 3,708,429 | 1/1973 | Hall | .................................. 252/158 X |
| 3,887,497 | 6/1975 | Uluild | .................................. 252/526 |
| 3,944,421 | 3/1976 | Lewis et al. | ......................... 430/299 |

FOREIGN PATENT DOCUMENTS

49-45321 12/1974 Japan .
52-116303 9/1977 Japan .

*Primary Examiner*—Edward C. Kimlin
*Attorney, Agent, or Firm*—Blanchard, Flynn, Thiel, Boutell & Tanis

[57] ABSTRACT

Disclosed is a liquid composition for treating photosensitive laminates having an alcohol-soluble polyamide layer, which comprises 12 to 70 parts by weight of an aromatic neutral salt, 0.01 to 10 parts by weight of an alkali, 1 to 15 parts by weight of an alcohol and 84 to 100 parts by weight of water.

7 Claims, No Drawings

LIQUID COMPOSITION FOR TREATING PHOTOSENSITIVE LAMINATES HAVING ALCOHOL-SOLUBLE POLYAMIDE LAYER

BACKGROUND OF THE INVENTION (1) Field of the Invention

The present invention relates to an improved liquid composition for treating photosensitive laminates having an alcohol-soluble polyamide layer. More particularly, the present invention relates to a liquid composition for treating a photosensitive laminate having an alcohol-soluble polyamide layer after it has been exposed to light.

(2) Description of the Prior Art

A photosensitive laminate having an alcohol-soluble polyamide layer, namely a laminate comprising an alcohol-soluble polyamide layer and a photosensitive photoresist layer, which are formed on a substrate in that order, or a laminate comprising a layer of an alcohol-soluble polyamide and a photosensitizing agent, formed on a substrate, can be widely used as an image-forming material for graphic designing or for the preparation of printing masters or printing plates.

As the conventional method for forming an image on such photosensitive laminate, there has been adopted a method in which after exposure to light, the photosensitive laminate is treated with a liquid developer such as an aqueous solution or alcoholic aqueous solution of sodium carbonate, sodium hydroxide or the like and then, the photosensitive laminate is treated with an etching solution. As the etching solution that is used for this two-pack type treatment method, there have been developed an aqueous solution of sodium salicylate or chroral hydrate (see Japanese Patent Publication No. 45321/74) and a lower alcohol-aqueous solution of sodium p-toluene-sulfonate (see Japanese Patent Application Laid-Open Specification No. 116303/77).

However, the conventional two-pack two-stage treatment method using a liquid developer and an etching solution is defective and disadvantageous in that two kinds of treating liquids should be prepared for formation of images and the treatment process involves many steps and is troublesome.

SUMMARY OF THE INVENTION

We made researches with a view to simplifying the above-mentioned image-forming treatment process by using one solution for both the development and etching treatments to effect development and etching in one stage by the treatment with this one solution, and we have now completed the present invention.

More specifically, the present invention provides a treating liquid composition comprising an alkaline alcoholic aqueous solution of an aromatic neutral salt, which is used for treating a photosensitive laminate having an alcohol-soluble polyamide layer after it has been exposed to light.

When the treating composition of the present invention is used, it is possible to perform the conventional development treatment and etching treatment simultaneously and promptly.

Furthermore, it has been confirmed that the resolving power attained by the one-stage treatment using the treating liquid composition of the present invention is comparable or superior to the resolving power attained by the conventional two-stage treatment method.

In accordance with the present invention, there is provided a liquid composition for treating laminates having an alcohol-soluble polyamide layer, which comprises 12 to 70 parts by weight of an aromatic neutral salt, 0.01 to 10 parts by weight of an alkali, 1 to 15 parts by weight of an alcohol and 84 to 100 parts by weight of water.

The proportions of the ingredients in the treating liquid composition of the present invention may be changed appropriately according to the kinds of the alcohol-soluble polyamide and photosensitive layer to be used.

In accordance with one preferred embodiment of the present invention, there is provided a liquid composition for treating photosensitive laminates having an alcohol-soluble polyamide layer, which comprises 12 to 50 parts by weight, especially 15 to 40 parts by weight, of an aromatic neutral salt, 0.1 to 10 parts by weight, especially 0.1 to 10 parts by weight, of an alkali, 1 to 6 parts by weight, especially 3 to 6 parts by weight, of an alcohol and 84 to 100 parts by weight, especially 84 to 97 parts by weight of water. The liquid composition of this embodiment is advantageous from the viewpoint of the sanitary safety because the alcohol concentration is relatively low.

In accordance with another embodiment of the present invention, there is provided a liquid composition for treating photosensitive laminates having an alcohol-soluble polyamide layer, which comprises 12 to 70 parts by weight, especially 20 to 60 parts by weight, of an aromatic neutral salt, 0.01 to 0.5 part by weight, especially 0.05 to 0.3 part by weight, of an alkali, 7 to 15 parts by weight, especially 7 to 14 parts by weight, of an alcohol and 85 to 94 parts by weight, especially 85 to 93 parts by weight, of water. Also the liquid composition of this embodiment is advantageous from the viewpoint of the sanitary safety because the alkali concentration is relatively low.

The present invention will now be described in detail.

DETAILED DESCRIPTION OF THE PREFERRED EMBODIMENTS

The aromatic neutral salt that is used in the present invention is selected from X,Y,Z-substituted benzenes and X,Y,Z-substituted naphthalenes in which X is a group selected from COONa and $SO_3Na$, Y is a group selected from H, OH, $NH_2$ and COONa and Z is a group selected from H, $CH_3$ and OH.

Among these aromatic neutral salts, sodium p-toluene-sulfonate, sodium o-toluene-sulfonate, sodium m-toluene-sulfonate, sodium salicylate, sodium sulfosalicylate, disodium o-phthalate, sodium anthranilate and sodium $\beta$-naphthalene-sulfonate are especially preferred. A mixture of two or more of these aromatic neutral salts may be used in the present invention.

As the alcohol that is used in the present invention, there can be mentioned, for example, lower alcohols such as methanol, ethanol and propyl alcohol, aromatic alcohols such as benzyl alcohol, glycols and glycol ethers such as ethyl cellosolve. From the viewpoints of the etching speed, the sharpness of etched lines and the safety, it is preferred to use a mixed alcohol of an aromatic alcohol and a lower alcohol. In this case, the mixing weight ratio of the two alcohols is preferably in the range of from 1/9 to 9/1.

As the alkali that is used in the present invention, there can be mentioned, for example, sodium hydroxide, sodium carbonate, sodium silicate and sodium metasilicate.

A surface active agent may be incorporated into the treating liquid composition of the present invention according to need.

As the photosensitive laminate to which the treating liquid composition of the present invention is applied, there can be mentioned, for example, a laminate comprising an alcohol-soluble polyamide layer formed on a substrate and a photosensitive photoresist layer formed on the polyamide layer and a laminate comprising a substrate and, formed thereon, a layer of an alcohol-soluble polyamide and a photosensitizing agent.

As the substrate, there can be used, for example, films of polymers such as polyethylene terephthalate, polycarbonate and acetyl cellulose, films or foils of metals such as aluminum and copper, and glass sheets.

The alcohol-soluble polyamide used in the present invention is a liner polyamide prepared from a dibasic fatty acid and a diamine, an ω-amino acid, a lactam or a derivative thereof according to known procedures. Not only homopolymers but also copolymers and block copolymers may be used. Furthermore, a polyamide having substituents on carbon or nitrogen atoms constituting the main chain may be used, and also a polyamide including linkages other than C—C and C—N—C linkages in the main chain may be used.

As typical instances of the polyamide, there can be mentioned linear polyamides such as nylon 3, nylon 4, nylon 5, nylon 6, nylon 8, nylon 11, nylon 12, nylon 13, nylon 66, nylon 610, nylon 1313, a polyamide derived from metaxylylenediamine and adipic acid, a polyamide derived from trimethylhexamethylenediamine and terephthalic acid and a polyamide derived from 1,4-diaminomethylcyclohexane and suberic acid, copolyamides such as nylon 6/66, nylon 6/66/610, nylon 6/66/610/612, nylon 6/66/12 and ε-caprolactam/adipic acid/hexamethylenediamine/4,4'-diaminocyclohexylmethane copolyamide, and N-methylol, N-alkoxylalkyl and N-aryloxyalkyl derivatives of polyamides. Of course, a mixture of two or more of these polyamides may be used. A coloring substance such as a dye or pigment may be incorporated in such polyamide layer so as to form a colored image opaque to actinic rays.

Any of photosensitive photoresists having such a property that the solubility in an aqueous solution of an alkali or water is selectively changed by light exposure can be used for the photosensitive photoresist layer in the present invention. These photosensitive photoresists are roughly divided into the light-solubilizable type and the non-light-solubilizable type.

Many photoresists have heretofore been proposed in "Light Sensitive Systems" written by Jaromir Kosar and other literature references. From the viewpoint of the resolving power, o-quinonediamide compounds, monoazide compounds and bisazide compounds are effectively used for the treating liquid composition of the present invention. These photoresists may be used singly, but in order to enhance the image strength and improve the coating-forming property, it is preferred that these photoresists be used in the form of mixtures or reaction products with a phenol-formalin resin, a cresol-formalin resin, a p- or m-substituted phenol-formalin resin, a styrene-maleic anhydride copolymer resin or the like. Photoresists of the light-solubilizable type include esters of Novalik resins with o-benzoquinone diazide or o-naphthoquinone diazide, such as disclosed in Japanese Patent Publications No. 9610/70, No. 5084/75, No. 24361/74 and No. 5083/75, and photoresists of the non-light-insolubilizable type include mixtures of bisazide or monoazide compounds with various resins, such as disclosed in Japanese Patent Publications No. 22082/70, No. 43284/73, No. 2081/78, No. 17323/72 and No. 7328/70.

As the photosensitizing agent (photo-crosslinking agent) used for formation of a layer of an alcohol-soluble polyamide and a photosensitizing agent, there can be used known photosensitizing agents such as bisacrylamides, diacrylates and polyhydric alcohol ethers of N-methylolamides.

The present invention will now be described in detail with reference to the following Examples that by no means limit the scope of the invention.

EXAMPLE 1

A coating composition comprising the following ingredients was coated in a thickness of about 20μ on a biaxially stretched polyethylene terephthalate film.

Alcohol-soluble copolymer nylon (6/66/610)—5 parts by weight
N-Methoxy-methylated nylon 6—5 parts by weight
Organic red dye—1 part by weight
Methanol—70 parts by weight
Toluene—20 parts by weight A negative type photosensitive liquid having the following composition was coated on the so formed alcohol-soluble polyamide layer to form a photosensitive photoresist layer having a thickness of about 3μ.

Novolak resin—10 parts by weight
2,6-Di-(4'-azidobenzal)-4-cyclo-hexanone—2 parts by weight
Solvent (methylethyl ketone/toluene=1/1)—70 parts by weight The so formed photosensitive laminate was exposed for 2 minutes to rays from a super-high pressure mercury lamp of 3 KW located 1 m apart from the laminate through a negative film, and the exposed laminate was dipped in a treating liquid composition shown in Table 1. After passage of about 1 minute, the laminate was taken out from the treating liquid composition. After a while, the treated laminate was lightly rubbed with absorbent cotton impregnated with the treating liquid composition, whereby the polyamide layer was clearly removed from the polyethylene terephthalate film in the open image area of the photoresist layer.

EXAMPLES 2 THROUGH 6 AND COMPARATIVE EXAMPLE 1

The procedures of Example 1 were repeated in the same manner as in Example 1 except that treating liquid compositions shown in Table 1 were used instead of the composition used in Example 1, and the states of the obtained images (states of the coatings) were examined to obtain results shown in Table 1.

TABLE 1

| | Example 1 | Example 2 | Example 3 | Example 4 | Example 5 | Example 6 | Comparative Example 1 |
|---|---|---|---|---|---|---|---|
| Treating Liquid Composition (parts by weight) | | | | | | | |
| Aromatic neutral | | | | | | | |

TABLE 1-continued

| | Example 1 | Example 2 | Example 3 | Example 4 | Example 5 | Example 6 | Comparative Example 1 |
|---|---|---|---|---|---|---|---|
| salt | | | | | | | |
| sodium toluene-sulfonate | 20 | 30 | 30 | 40 | 0 | 40 | 0 |
| sodium salicylate | 0 | 0 | 0 | 0 | 15 | 0 | 0 |
| Alkali | | | | | | | |
| sodium hydroxide | 0 | 0.2 | 0.3 | 0.2 | 0.2 | 0.2 | 0.2 |
| sodium silicate | 5 | 0 | 0 | 0 | 0 | 0 | 0 |
| Alcohol | | | | | | | |
| isopropyl alcohol | 0 | 1.5 | 0 | 1 | 1.5 | 0 | 1.5 |
| benzyl alcohol | 3 | 2 | 1 | 2 | 2 | 0 | 2 |
| ethyl cellosolve | 0 | 0 | 0 | 0 | 0 | 5 | 0 |
| Water | 92 | 96.3 | 98.7 | 96.8 | 96.3 | 94.8 | 96.3 |
| State of Coating | good | good | good | good | good | good | polyamide layer left |

EXAMPLE 7

A polyamide layer was formed in the same manner as described in Example 1 except that N-butoxymethylated nylon 6 was used instead of N-methoxymethylated nylon 6 in the coating composition used in Example 1. Then, a positive type photosensitive liquid composition indicated below was coated on the polyamide layer in the same manner as described in Example 1, to form a photoresist layer.

Adduct of 1,2-naphthoquinonediazido (2)-5-sulfonyl chloride to acetone-pyrogallol condensate—1 part by weight
Novolak type phenolic resin—2 parts by weight
Methyl cellosolve acetate—13 parts by weight
Methylethyl ketone—12 parts by weight In the same manner as described in Example 1, the obtained photosensitive material was exposed to light and treated with a treating liquid having the following composition. Obtained results were as good as those obtained in Example 1.

Sodium p-toluene sulfonate—20 parts by weight
Sodium hydroxide—0.1 part by weight
Isopropyl alcohol—3.5 parts by weight
Benzyl alcohol—1 part by weight
Water—95.2 parts by weight
Surface active agent (sodium lauryl sulfate)—0.2 part by weight

EXAMPLE 8

A coating composition indicated below was coated in a thickness of about 20μ on a biaxially stretched polyethylene terephthalate film.

Alcohol-soluble polyamide
  Nylon 6/66/610 copolymer (40/30/30 weight ratio)—5 parts by weight
  N-Methoxymethylated nylon 6—5 parts by weight
Organic red dye—1 part by weight
Methanol—70 parts by weight
Toluene—20 parts by weight A positive type photosensitive liquid having the following composition was prepared and coated on the so obtained alcohol-soluble polyamide layer to form a photosensitive photoresist layer having a thickness of about 3μ.

Alkali-soluble phenol-novolak resin—5 parts by weight
Condensate of 1,2-naphthoquinone-diazido (2)-5-sulfonyl chloride with alkali-soluble phenol-novolak resin—5 parts by weight
Methylethyl ketone—54 parts by weight
Ethyl cellosolve acetate—27 parts by weight
Butyl acetate—9 parts by weight The so obtained photosensitive laminate was exposed for 2 minutes to rays from a super-high pressure mercury lamp of 2 KW located 1 m apart from the laminate through a negative film, and the exposed laminate was dipped in a treating liquid composition shown in Table 2. After passage of about 1 minute, the laminate was taken out from the treating liquid composition. After a while, the treated laminate was lightly rubbed with absorbent cotton impregnated with the treating liquid composition. The polyamide layer was clearly removed from the polyethylene terephthalate film in an open image area of the photoresist layer.

EXAMPLES 9 THROUGH 11

The procedures of Example 8 were repeated in the same manner as in Example 8 except that treating liquid compositions shown in Table 2 were used instead of the composition used in Example 8, and the states of the obtained images (states of the coatings) were examined to obtain results shown in Table 2.

TABLE 2

| | Example 8 | Example 9 | Example 10 | Example 11 |
|---|---|---|---|---|
| Treating Liquid Composition (parts by weight) | | | | |
| Aromatic neutral salt | | | | |
| sodium salicylate | 0 | 0 | 20 | 15 |
| sodium toluene-sulfonate | 40 | 50 | 0 | 0 |
| Alkali | | | | |
| sodium metasilicate | 0.1 | 0.3 | 0 | 0.3 |
| sodium hydroxide | 0 | 0 | 0.05 | 0 |
| Alcohol | | | | |
| isopropyl alcohol | 6 | 9 | 4 | 5 |
| benzyl alcohol | 8 | 0 | 3 | 4 |
| Surface active agent | 0.3 | 0.1 | 0 | 0 |
| Water | 85.9 | 90.7 | 92.95 | 90.7 |
| State of Image | good | good | good | good |

EXAMPLE 12

A polyamide layer was formed in the same manner as described in Example 8 except that 10 parts by weight of nylon 6/66/610 alone was used as the alcohol-soluble polyamide in the coating composition used in Example 8. Then, a negative type photosensitive liquid having the following composition was coated on the so obtained polyamide layer in the same manner as described in Example 8, to form a photoresist layer.

Novolak resin—10 parts by weight,
2,6-Di-(4'-azidobenzal)-4-cyclohexanone—2 parts by weight
Methylethyl ketone—44 parts by weight
Toluene—44 parts by weight.

In the same manner as described in Example 8, the so obtained photosensitive material was exposed to light, and when the exposed photosensitive material was treated with a treating liquid composition indicated below, results as good as those obtained in Example 8 were obtained.

Sodium p-toluene-sulfonate—50 parts by weight,

Sodium hydroxide—0.1 part by weight,
Isopropyl alcohol—4 parts by weight,
Benzyl alcohol—4 parts by weight,
Surface active agent—0.2 part by weight,
Water—91.9 parts by weight.

What is claimed is:

1. A liquid composition for treating photosensitive laminates having an alcohol-soluble polyamide layer formed on a substrate, which comprises 12 to 70 parts by weight of an aromatic neutral salt selected from X,Y,Z-substituted benzenes and X,Y,Z-substituted naphthalenes in which X is a group selected from COONa and SO$_3$Na, Y is a group selected from H, OH, NH$_2$ and COONa and Z is a group selected from H, CH$_3$ and OH, 0.01 to 10 parts by weight of an alkali, 1 to 15 parts by weight of alcohol and 84 to 100 parts by weight of water.

2. A treating liquid composition as set forth in claim 1 wherein the aromatic neutral salt/alkali/alcohol/water weight ratio is (12–50)/(0.1–10)/(1–6)/(84–100).

3. A treating liquid composition as set forth in claim 1 wherein the aromatic neutral salt/alkali/alcohol/water weight ratio is (12–70)/(0.01–0.5)/(7–15)/(85–94).

4. A treating liquid composition as set forth in claim 1, claim 2 or claim 3 wherein the alcohol is a member selected from methanol, ethanol, propyl alcohol, benzyl alcohol and ethyl cellosolve, and the alkali is a member selected from sodium hydroxide, sodium carbonate, sodium silicate and sodium metasilicate.

5. A treating liquid composition as set forth in claim 4 wherein the alcohol is a mixture of benzyl alcohol and a lower alcohol selected from the group consisting of methanol, ethanol and propyl alcohol, in which the mixing weight ratio of the two alcohols is in the range of from 1/9 to 9/1.

6. A treating liquid composition as set forth in claim 1, claim 2 or claim 3 in which said aromatic neutral salt is selected from the group consisting of sodium p-toluene-sulfonate, sodium o-toluene-sulfonate, sodium m-toluene-sulfonate, sodium salicylate, sodium sulfosalicylate, disodium o-phthalate, sodium anthranilate and sodium β-naphthalene-sulfonate.

7. A treating liquid composition as set forth in claim 5 in which said aromatic neutral salt is selected from the group consisting of sodium p-toluene-sulfonate, sodium o-toluene-sulfonate, sodium m-toluene-sulfonate, sodium salicylate, sodium sulfosalicylate, disodium o-phthalate, sodium anthranilate and sodium β-naphthalene-sulfonate.

* * * * *